United States Patent
Shibata et al.

(10) Patent No.: US 8,380,917 B2
(45) Date of Patent: Feb. 19, 2013

(54) COMMAND CONTROL FOR SYNCHRONOUS MEMORY DEVICE

(75) Inventors: Kenji Shibata, Kani (JP); Mitsuhiro Nagao, Gifu-Prefecture (JP); Satoru Kawmoto, Owarasahi (JP)

(73) Assignee: Spansion LLC, Sunnyvale, CA (US)

( * ) Notice: Subject to any disclaimer, the term of this patent is extended or adjusted under 35 U.S.C. 154(b) by 970 days.

(21) Appl. No.: 12/138,307

(22) Filed: Jun. 12, 2008

(65) Prior Publication Data
US 2009/0150635 A1 Jun. 11, 2009

(30) Foreign Application Priority Data
Jun. 12, 2007 (JP) ................. 2007-154630

(51) Int. Cl.
*G06F 12/00* (2006.01)
*G06F 13/28* (2006.01)
*G06F 13/00* (2006.01)
(52) U.S. Cl. . 711/103; 711/154; 711/167; 711/E12.002; 365/189.2; 710/5
(58) Field of Classification Search ............. 711/103, 711/154, 167, E12.002; 365/189.2; 710/5
See application file for complete search history.

(56) References Cited

U.S. PATENT DOCUMENTS
2004/0062126 A1 * 4/2004 Takemae ................ 365/222

FOREIGN PATENT DOCUMENTS
JP 3725479 10/2003

* cited by examiner

*Primary Examiner* — Edward Dudek, Jr.

(57) ABSTRACT

Systems, methods, and circuits for command control for synchronous memory device are disclosed. In one embodiment, a memory device comprises a first synchronous memory controlled by a second group of commands which includes a first command receiving section for receiving a first group of commands, and a second command receiving section for receiving a command that is unique to the first synchronous memory and different from the first group of commands during execution of the first group of commands received by the first command receiving section. The synchronous memory further comprises a second synchronous memory controlled by the first group of commands, where the first synchronous memory and the second synchronous memory are coupled to a same data bus, and where the second group of commands is different from the first group of commands.

20 Claims, 8 Drawing Sheets

COMMAND CONTROL FOR SYNCHRONOUS MEMORY DEVICE

CLAIM OF PRIORITY

This application claims priority from Japanese patent application 2007-154630 filed on Jun. 12, 2007.

FIELD OF TECHNOLOGY

The present invention relates to semiconductor devices and methods, particularly to command control of synchronous memory devices.

BACKGROUND

Japanese Patent No. 3725479 (hereinafter "prior art") discloses a synchronous memory that employs the command architecture of a volatile memory (e.g., a synchronous dynamic random access memory (SDRAM)) to access a non-volatile memory (e.g., a synchronous flash memory), where the command architecture enables decoding commands unique to the non-volatile memory.

In the synchronous memory, three command pins used as a refresh command to the SDRAM are used for a load command resistor (LCR) command to the flash memory. To perform a write operation, the synchronous memory uses the LCR command for decoding a PROGRAM setup or ERASE setup that is not used in the SDRAM but is used in the flash memory. The synchronous memory executes a LCR-ACTIVE-WRITE command cycle in which three continuous commands are issued to perform an ERASE operation to a specific memory block. In this command cycle, an ERASE set command is issued in the first cycle and the bank address of the memory block, which is being erased, is issued in the second cycle. Then, in the third cycle of the command cycle, a WRITE command is issued, and the ERASE operation starts to erase the block which has been addressed.

However, in the synchronous memory, in order to ensure compatibility with the SDRAM and to determine whether the PROGRAM setup or the ERASE setup has been instructed, the LCR command has to be issued prior to issuance of the ACTIVE command that enables an access to the synchronous memory. To this end, issuance of the LCR command becomes necessary in addition to issuance of the ACTIVE command and the WRITE command, thus increasing a chance of interrupting data output of the SDRAM by issuing the LCR command to the flash memory. Thus, the interruption of the data output of the SDRAM by the LCR command may cause difficulties in ensuring the flash memory's compatibility with the SDRAM and cause delays in memory access operations.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a synchronous memory having a first synchronous memory controlled by a second group of commands. The first synchronous memory includes a first command receiving section for receiving a first group of commands and a second command receiving section for receiving a command that is unique to the first synchronous memory and different from the first group of commands during execution of the first group of commands received by the first command receiving section. The synchronous memory further comprises a second synchronous memory controlled by the first group of commands, where the first synchronous memory and the second synchronous memory are coupled to a same data bus, and where the second group of commands is different from the first group of commands.

Another embodiment of the present invention is directed to a synchronous memory which comprises a first synchronous memory controlled by a second group of commands and a second synchronous memory controlled by a first group of commands. The synchronous memory further comprises a synchronous memory controller for issuing the first group of commands in response to a clock signal and for issuing a command that is unique to the first synchronous memory and different from the first group of commands. The first synchronous memory and the second synchronous memory are coupled to a same data bus, and the second group of commands is different from the first group of commands.

Yet another embodiment of the present invention is directed to a synchronous memory control method which comprises receiving a first group of commands for controlling a second synchronous memory in a first command receiving section of a first synchronous memory controlled by a second group of commands, and receiving a command that is unique to the first synchronous memory and different from the first group of commands in a second command receiving section during execution of the first group of commands. The first synchronous memory and the second synchronous memory are coupled to a same data bus, and the second group of commands is different from the first group of commands.

As will be illustrated in the detailed description, other embodiments pertain to synchronous memory systems, methods, and circuits that reduce a delay in data processing, where the synchronous memory has a volatile memory and a non-volatile memory coupled to the same data bus. By processing one or more commands unique to the first synchronous memory (e.g., the flash memory) while executing a group of commands for controlling the second synchronous memory (e.g., the SDRAM), a need for an additional clock cycle for processing the commands unique to the first synchronous memory can be eliminated. This, in turn, improves the speed of the synchronous memory system. Additionally, the interruption of the data output of the second synchronous memory can be avoided at least in part using the data processing scheme.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to synchronous memory systems, methods, and circuits that reduce a delay in data processing, where the synchronous memory has a volatile memory and a non-volatile memory coupled to the same data bus. By processing one or more commands unique to the first synchronous memory (e.g., the flash memory) while executing a group of commands for controlling the second synchronous memory (e.g., the SDRAM), a need for a special cycle for processing the commands unique to the first synchronous memory can be eliminated. This, in turn, improves the speed of the synchronous memory system. Additionally, the interruption of the data output of the second synchronous memory can be avoided at least in part using the data processing scheme.

First Embodiment

Figure 1:
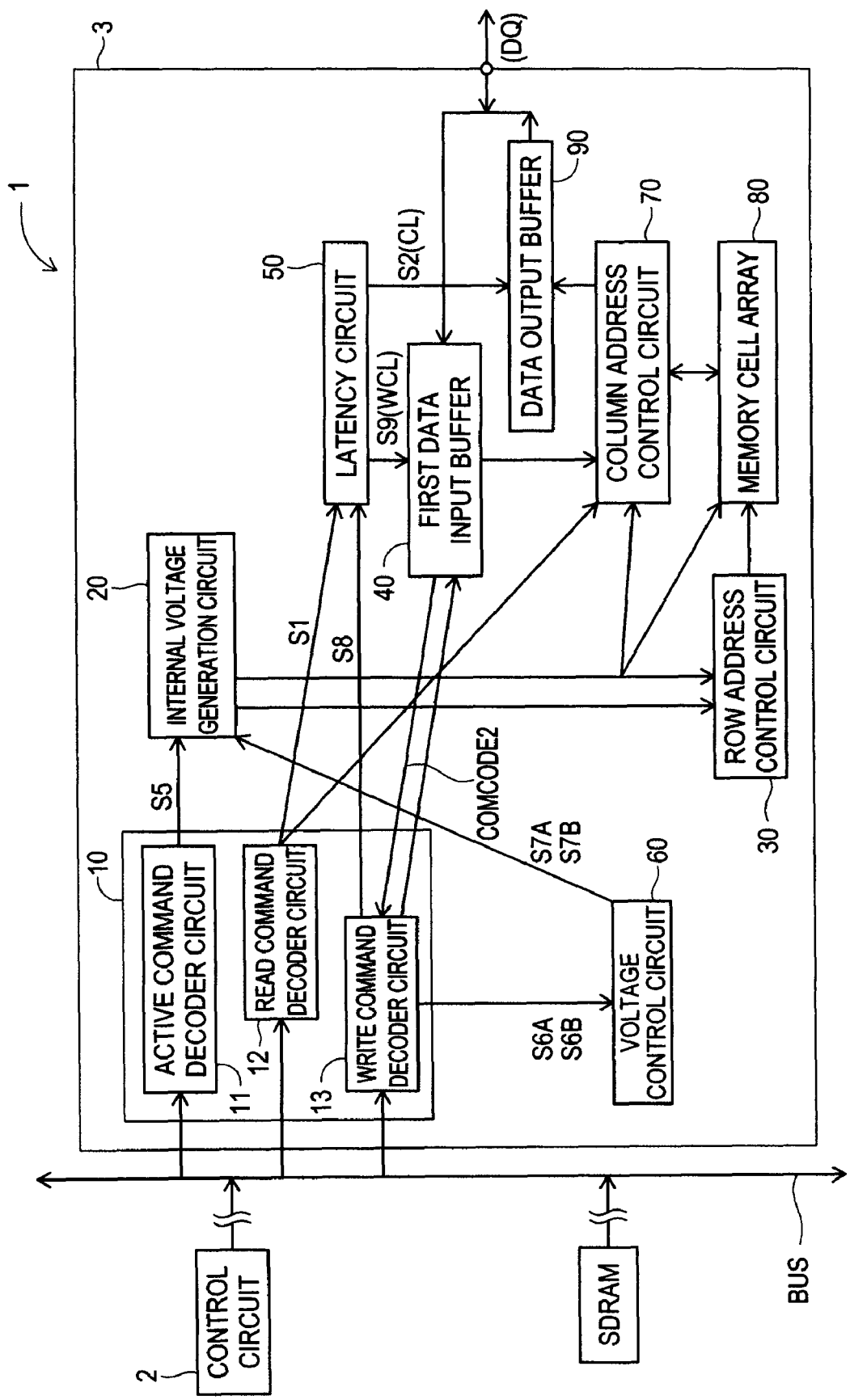
FIG. 1 is a schematic block diagram showing the circuit configuration of a memory system according to a first embodiment.

Referring now to FIG. 1, a first embodiment of the invention will be described. The first embodiment will be explained taking the case of a memory system for example according to which a synchronous memory controller is coupled to a synchronous DRAM and synchronous flash memory that perform control in response to a common control signal, common address signal, and common data input/output signal. FIG. 1 is a schematic block diagram showing the circuit configuration of a memory system 1. Arrows of FIG. 1 indicate the transmitting directions of various signals and the feeding directions of generated voltage. The memory system 1 has a control circuit 2 that is a so-called synchronous memory controller; a synchronous flash memory 3 that is a nonvolatile memory; a synchronous DRAM (SDRAM) that is a volatile memory; and a bus BUS. Coupled to the bus BUS are a clock signal line for commonly connecting the control circuit 2 to a plurality of memory devices; a clock enable signal line; a plurality of signal lines for transmitting commands; a plurality of address lines; a plurality of I/O lines (DQ lines) etc. The plurality of memory devices (the synchronous DRAM and the synchronous flash memory 3) may have pin-compatible configuration except a chip select signal pin.

An ACTIVE command, READ command and WRITE command issued by the control circuit 2 serve as a basis for the command control system common to the SDRAM and the synchronous flash memory 3. A PROGRAM setup command and ERASE setup command, which are unique commands to the synchronous flash memory 3, are commands for the WRITE control system. The SDRAM, which is a volatile memory, performs bit-line voltage reverse control with a write amp when changing memory cell data from "0" to "1" or vice versa. In the SDRAM, the same voltage is applied when changing memory cell data from "0" to "1" and vice versa. In contrast with this, the synchronous flash memory 3, which is a nonvolatile memory, has irreversibility between changing memory cell data from "0" to "1" (ERASE) and changing memory cell data from "1" to "0" (PROGRAM) by utilizing the solid state properties of hot electron injection and FN tunneling. That is, the synchronous flash memory 3 uses different voltages for erasing and programming. Accordingly, the PROGRAM setup command and ERASE setup command are unique commands to the synchronous flash memory 3.

Although not shown in the drawings, the control circuit 2 has a clock generation circuit. The control circuit 2 corresponds to the synchronous memory controller of the invention. Coupled to the bus BUS are the control circuit 2, the synchronous flash memory 3 and the SDRAM. The synchronous flash memory 3 corresponds to the first synchronous memory of the invention. The SDRAM corresponds to the second synchronous memory of the invention.

In view of the irreversibility mentioned above, the control circuit 2 sorts out memory cells to be erased and memory cells to be programmed with a soft ware (not shown). The control circuit 2 issues additional information (ERASE setup command and PROGRAM setup command) in addition to a WRITE command commonly used by the synchronous flash memory 3 and the SDRAM. The additional information (ERASE setup command and PROGRAM setup command) informs ERASE or PROGRAM and corresponds to the unique command of the invention.

The synchronous flash memory 3 has a command decoder circuit 10 for recognizing various commands issued from the control circuit 2; an internal voltage generation circuit 20; a row address control circuit 30; a first data input buffer 40; a latency circuit 50; a voltage control circuit 60; a column address control circuit 70; a memory cell array 80; and a data output buffer 90. The internal voltage generation circuit 20 corresponds to the voltage generating section of the invention. The column address control circuit 70 includes a sense amp for reading memory cell data from the memory cell array 80 and a write amp for writing memory cell data in a memory cell.

The command decoder circuit 10 has an active command decoder circuit 11 for recognizing an ACTIVE command issued from the control circuit 2; a read command decoder circuit 12 for recognizing a READ command issued from the control circuit 2; and a write command decoder circuit 13 for recognizing a WRITE command issued from the control circuit 2. The write command decoder circuit 13 recognizes a PROGRAM setup command and ERASE setup command which are unique to the synchronous flash memory 3. The decoder circuits 11 to 13 are coupled to the bus BUS such that a chip select signal and a low address strobe signal RAS, column address strobe signal CAS, write enable signal WE etc. which are input to the command decoder circuit of the SDRAM are transferred to the bus BUS. The active command decoder circuit 11 corresponds to the active command receiving section of the invention. The active command decoder circuit 11, the read command decoder circuit 12 and the write command decoder circuit 13 correspond to the first command receiving section of the invention. The write command decoder circuit 13 corresponds to the WRITE command receiving section of the invention.

The internal voltage generation circuit 20 is coupled to the active command decoder circuit 11 provided in the command decoder circuit 10. The row address control circuit 30 is coupled to the internal voltage generation circuit 20. The first data input buffer 40 is coupled to the write command decoder circuit 13 provided in the command decoder circuit 10. The latency circuit 50 is coupled to the read command decoder circuit 12 and the write command decoder circuit 13. An external clock signal CLK is input to the latency circuit 50. The voltage control circuit 60 is coupled to the write command decoder circuit 13 provided in the command decoder circuit 10. Further, the voltage control circuit 60 is coupled to the internal voltage generation circuit 20. The column address control circuit 70 is coupled to the internal voltage generation circuit 20.

Figure 2:
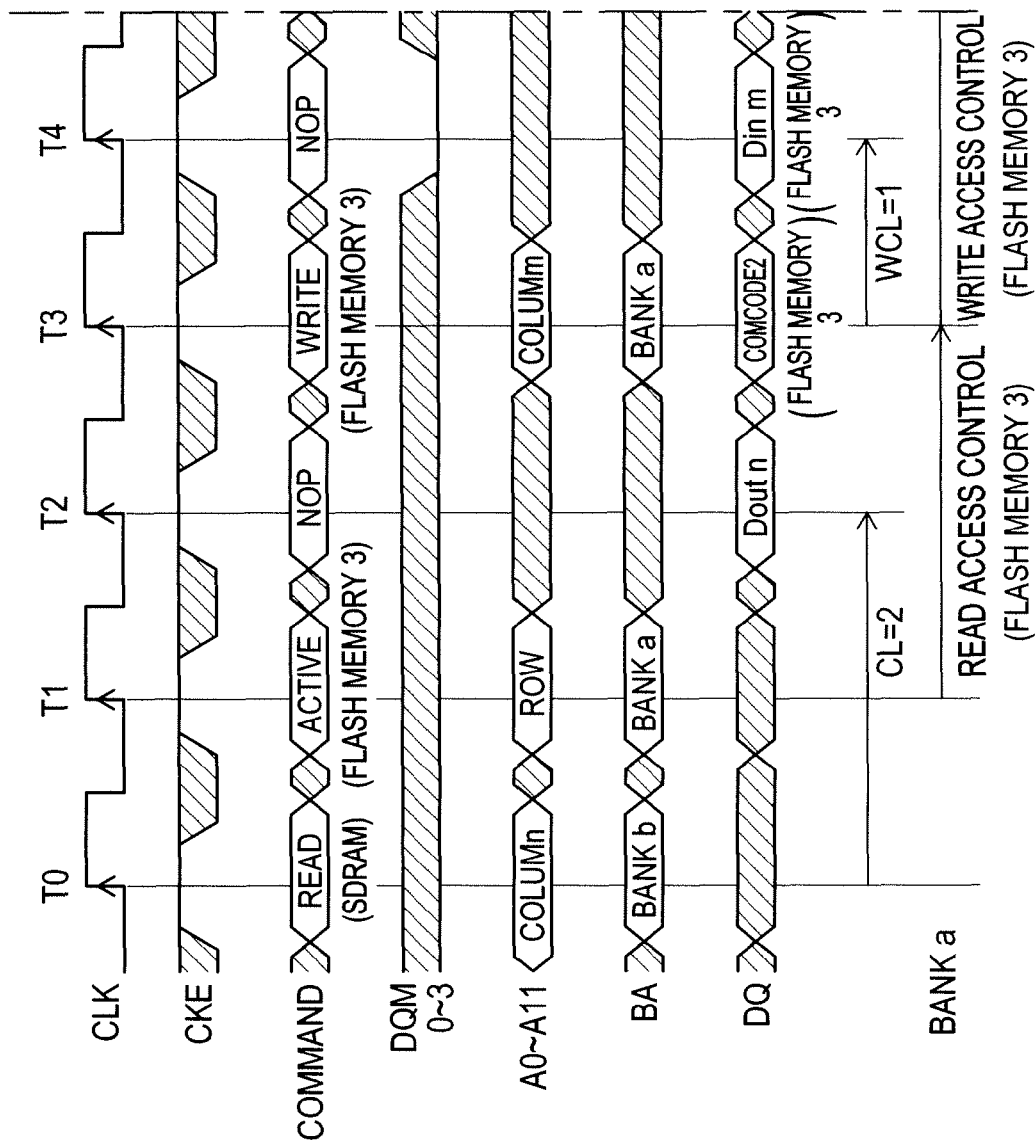
FIG. 2 is a timing chart showing the operation of the memory system according to the first embodiment.

The memory cell array 80 is coupled to the internal voltage generation circuit 20 and the row address control circuit 30. Further, the memory cell array 80 is coupled to the data output buffer 90 through the column address control circuit 70. The first data input buffer 40 and the data output buffer 90 are coupled to the data input/output terminal (DQ) of the synchronous flash memory 3. The latency circuit 50 is coupled to the first data input buffer 40 and the data output buffer 90. The first data input buffer 40 corresponds to the second command receiving section of the invention. Next, the operation of the memory system 1 will be described with reference to the timing chart shown in FIG. 2. In FIG. 2, Code CLK designates a clock signal; CKE designates a clock enable signal; DQM0 to DQM3 designate an input mask terminal; A0 to A11 designate a signal input terminal; BA designates a bank address input terminal; and DQ designates a data input/output terminal. A chip select signal CS1 that makes the control circuit 2 select the SDRAM and a chip select signal CS2 that makes the control circuit 2 select the synchronous flash memory 3 are omitted from the drawing.

The internal clock generation circuit provided in the control circuit 2 generates the clock signal CLK shown in FIG. 2. The control circuit 2 sends an ACTIVE command to the SDRAM prior to time T0 and sends a READ command READ to the SDRAM at time T0 as shown in FIG. 2. At that time, the inputs of input mask terminals DQM0 to DQM3 are maintained at "DON't CARE". A column address value COLUMn is input to the SDRAM through the signal input terminals A0 to A11 of the SDRAM by way of the bus BUS. In addition, a bank address value BANKb is input to the SDRAM through the bank address input terminal BA of the SDRAM by way of the bus BUS.

In the SDRAM, a column address is selected by the column address value COLUMn, and the bank address of a memory cell array of the SDRAM is selected by the bank address value BANKb. The READ command READ, column address and bank address are latched on the rising edge (time T0) of the clock signal CLK. In the SDRAM, after the READ command READ has been latched and a CAS latency (which is, herein, CL=2 shown in FIG. 2), which is a READ latency, has elapsed, data Dout n is output through the data input/output terminal DQ by way of the sense amp and data output buffer of the column address control circuit of the SDRAM.

In the synchronous flash memory 3, after the active command ACTIVE is input to the control circuit 2 at time T1, an access to the memory cell array 80 becomes possible. The active command ACTIVE is decoded by the active command decoder circuit 11 of the command decoder circuit 10 and an active operation command signal S5 (see FIG. 1) transitions to a High level (active state). The active command ACTIVE corresponds to the active command of the invention. The high-level active operation command signal S5 is sent to the internal voltage generation circuit 20. After supplied with the high-level active operation command signal S5, the internal voltage generation circuit 20 generates a READ voltage necessary for a read access to a memory cell of the memory cell array 80, as an initial operation. At time T1, it cannot be determined whether the activated memory cell array 80 is in a READ mode or a WRITE mode. Further, it cannot be determined whether the activated memory cell array 80 is in a PROGRAM mode or an ERASE mode, these modes being included in the WRITE mode and unique to the synchronous flash memory 3. The reason why the READ voltage necessary for read access is generated at time T1 is that a read access speed value can be determined in priority to a write access speed value.

The row address control circuit 30 of the synchronous flash memory 3 selects a row address of the memory cell array 80 with a row address value ROW input through a signal input terminal coupled to an address buffer (not shown). In addition, the row address control circuit 30 selects a bank address of the memory cell array 80 with a bank address value BANKa input through a bank address input terminal coupled to the address buffer (not shown). The selected row address and selected bank address are latched together with the active command ACTIVE on the rising edge of the clock signal CLK (time T1). By latching the active command ACTIVE, readout access control to the memory cell array 80 is started. The latched row address and latched bank address are used for selection of a row and bank to be accessed. The READ voltage is applied to a memory cell to be accessed, in accordance with the selected row and selected bank. Thus, the read access control for BANKa starts from time T1, as shown in FIG. 2.

In the synchronous flash memory 3, a column address and a bank address are selected in accordance with the column address value and the bank address value and a memory cell to be accessed is selected. After the CAS latency (which is, herein, the same as CL=2 shown in FIG. 2), which is a READ latency from the READ command READ, has elapsed, memory cell data read from the selected memory cell is sent to the data output buffer 90 so that data Dout n is output through the data input/output terminal DQ.

In this embodiment, as shown in FIG. 1, the read command decoder circuit 12 transmits a READ command latch signal S1 to the latency circuit 50. Upon receipt of the READ command latch signal S1, the latency circuit 50 transmits a CAS LATENCY command signal S2 to the data output buffer 90. The CAS latency (CL=2) is set by the CAS LATENCY command signal S2. On the rising edge (time T2) of the clock signal CLK during which a read access to BANKa is made by the synchronous flash memory 3, the data Dout n is output to the bus BUS from the input/output terminal DQ of the SDRAM in accordance with the READ command issued to the SDRAM by the control circuit 2 at time T1. Next, the ERASE setup command and PROGRAM setup command will be explained. The synchronous flash memory 3 needs to receive the PROGRAM setup command and ERASE setup command in addition to the WRITE command WRITE used for SDRAM, prior to starting of WRITE access control to the memory cell array 80. The PROGRAM setup command and ERASE setup command are respectively expressed by a combination of external signal terminals or a code. In cases where the PRGRAM setup command and ERASE setup command are represented by a code, the following codes are given. Specifically, if the control circuit 2 instructs DATA WRITE operation on the memory cell array 80, the setup command is coded by 40 in hexadecimal notation. If the control circuit 2 instructs ERASE operation on the memory cell array 80, the setup command is coded by 20 in hexadecimal notation.

The PROGRAM setup command is used for writing data in the memory cell array 80. The ERASE setup command is used for erasing data in the memory cell array 80. The PROGRAM setup command corresponds to the PROGRAM mode operation command of the invention. The ERASE setup command corresponds to the ERASE mode operation command of the invention. After the write command decoder circuit 13 of the command decoder circuit 10 has input a WRITE command WRITE released from the control circuit 2, the WRITE command WRITE is decoded by the write command decoder circuit 13. The write command decoder circuit 13 outputs a LATCH command to the first data input buffer 40 for latching the data in the data input/output terminal DQ. At time T3, the control circuit 2 issues, in addition to the WRITE command, additional information (ERASE setup command, PROGRAM setup command) for determining whether ERASE or PROGRAM has been instructed. Further, at time T4 after a WRITE latency (e.g., WCL=1 shown in FIG. 2) has been elapsed since time T3, the control circuit 2 issues WRITE data Din m. Thereby, the synchronous flash memory 3 latches the WRITE data Din m at time T4 after latching the WRITE command and the PROGRAM setup command at time T3.

In this embodiment, a data input/output terminal DQ (see FIG. 1), which is not inputting nor outputting a command at time T3, receives the ERASE setup command or the PROGRAM setup command released from the control circuit 2, as a data command code COMCODE 2 (see FIG. 2). The data input/output terminal DQ which is not inputting nor outputting a command at that time corresponds to an idle terminal of the invention. The ERASE setup command and the PROGRAM setup command are input to the write command decoder circuit 13 through the first data input buffer 40. The data information which has been issued by the control circuit 2 and is to be written in a memory cell is input through the data input/output terminal DQ after a CAS latency (which is, herein, WCL=1 shown in FIG. 2), that is a WRITE latency, has elapsed (time T4). If the WRITE data was issued before T3, the input of the input mask terminal DQM is maintained at a low level, which indicates that the WRITE data is not to be nullified. To maintain the input of the input mask terminal DQM at a low level is necessary for making WRITE data for the data input/output terminal DQ of every group unit effective and it is executed by the user making user selection.

In addition, at time T3, the column address control circuit 70 selects a column address of the memory cell array 80 in accordance with the column address value COLUMm input through the signal input terminals A0 to A11 coupled to an address buffer (not shown). Further, the column address control circuit 70 selects a bank address of the memory cell array 80 in accordance with a bank address value BANKa input through the bank address input terminal BA coupled to an address buffer (not shown). On the rising edge of the clock signal CLK (time T3), the selected column address and selected bank address are latched together with the WRITE command WRITE and the ERASE setup command (COMCODE 2) or PROGRAM setup command (COMCODE 2). If the WRITE command WRITE has been already issued, the input of the input mask terminal DQM is maintained at "DON't CARE".

At time T3, the voltage control circuit 60 changes control from READ access control to BANKa to WRITE access control to BANKa. The voltage control circuit 60 controls the internal voltage generation circuit 20 to change generated voltage from the READ voltage necessary for READ access to a voltage necessary for DATA WRITE operation to be performed on the memory cell array 80 or a voltage necessary for ERASE operation to be performed on the memory cell array 80. More concretely, the write command decoder circuit 13 transmits a SETUP command signal S6 to the voltage control circuit 60 as shown in FIG. 1 after latching the WRITE command WRITE and the ERASE setup command or PRGRAM setup command. If the write command decoder circuit 13 receives an input of the PRGRAM setup command from the first data input buffer 40, the write command decoder circuit 13 transmits a SETUP command S6A to the voltage control circuit 60. On the other hand, if the write command decoder circuit 13 receives an input of the ERASE setup command, the write command decoder circuit 13 transmits a SETUP command S6B to the voltage control circuit 60.

Upon receipt of the SETUP command S6A, the voltage control circuit 60 transmits a PROGRAM voltage control signal S7A to the internal voltage generation circuit 20. Upon receipt of the PROGRAM voltage control signal S7A, the internal voltage generation circuit 20 stops the generation of the READ voltage. Thereafter, the internal voltage generation circuit 20 generates a PROGRAM voltage necessary for writing data in a memory cell of the memory cell array 80. The voltage control circuit 60 corresponds to the generation voltage alteration section of the invention. The PROGRAM voltage is applied to a memory cell to be accessed in accordance with the row selected by the row address control circuit 30, the column selected by the column address control circuit 70 and the bank address selected by the bank address value. Thereby, the WRITE access control to BANKa starts at time T3, as shown in FIG. 2. In this embodiment, after the WRITE command WRITE has been latched and the CAS latency (which is, herein, WCL=1 shown in FIG. 2) in WRITE access control has elapsed, data Din m input through the data input/output terminal DQ is written in the memory cell by the column address control circuit 70. In this embodiment, the write command decoder circuit 13 transmits a WRITE command latch signal S8 to the latency circuit 50 as shown in FIG. 1.

Upon receipt of the WRITE command latch signal S8, the latency circuit 50 transmits a CAS latency command signal S9 to the first data input buffer 40. The CAS latency (WCL=1) in WRITE access control is set by the CAS latency signal S9. That is, the first data input buffer 40 latches the ERASE setup command (COMCODE 2) or PROGRAM setup command (COMCODE 2) from the data input/output terminal DQ at time T3 and latches the WRITE data at time T4. Thus, the first data input buffer 40 performs latching operation twice.

Upon receipt of the SETUP command S6B, the voltage control circuit 60 transmits an ERASE voltage control signal S7B to the internal voltage generation circuit 20. Upon receipt of the ERASE voltage control signal S7B, the internal voltage generation circuit 20 stops the generation of the READ voltage. Thereafter, the internal voltage generation circuit 20 generates an ERASE voltage necessary for erasing data from the memory cell of the memory cell array 80. The ERASE voltage is applied to the memory cell to be accessed in accordance with the row selected by the row address control circuit 30, the column selected by the column address control circuit 70 and the bank address selected by the bank address value. Thereby, the WRITE access control for BANKa starts at time T3, as shown in FIG. 2. It should be noted that data erasing in the memory cell array area may be performed on a sector basis. The PROGRAM voltage or ERASE voltage corresponds to the WRITE voltage of the invention.

In this embodiment, the latching of the ACTIVE command ACTIVE and the latching of the WRITE command WRITE correspond to the first command receiving step of the invention. In this embodiment, the latching of the ERASE setup command and the latching of the PROGRAM setup command correspond to the second receiving step of the invention.

In the memory system 1 of this embodiment equipped with the control circuit 2, the SDRAM and the synchronous flash memory 3, the write command decoder circuit 13 of the synchronous flash memory 3 latches the ERASE setup command or the PROGRAM setup command in synchronization with the rising edge (time T3) of the clock signal CLK within an active command/write command execution cycle during which a group of commands is executed in response to the ACTIVE command ACTIVE latched by the active command decoder circuit 11 of the synchronous flash memory 3 and the WRITE command WRITE to be used in the SDRAM. In this embodiment, there is accordingly no need to provide a special cycle period for latching the ERASE setup command or the PROGRAM setup command before inputting the ACTIVE command to the synchronous flash memory 3, apart from the active command/write command execution cycle during which a group of commands is executed. Accordingly, the first embodiment does not require a special cycle period and therefore does not present such a problem, unlike the prior art, that a special cycle period overlaps the SDRAM data output period, interrupting the output of data from the SDRAM. As a result, in this embodiment, the utilization efficiency of the bus BUS coupled to the SDRAM and the synchronous flash memory 3 can be increased and the read access speed of the synchronous flash memory 3 can be restrained from dropping.

According to the method of controlling the synchronous flash memory 3 of the first embodiment, the ERASE setup command or the PROGRAM setup command is latched in synchronization with the rising edge (time T3) of the clock signal CLK within the active command/write command execution cycle executed in response to the ACTIVE command ACTIVE and the WRITE command WRITE. This eliminates the need to provide a special cycle period for latching the ERASE setup command or the PROGRAM setup command before inputting the ACTIVE command to the synchronous flash memory 3, except the active command/write command execution cycle. Accordingly, the control method of this embodiment does not require a special cycle period and therefore does not present such a problem, unlike the prior art, that a special cycle period overlaps the SDRAM data output period, interrupting the output of data from the SDRAM. As a result, in this embodiment, the utilization efficiency of the bus BUS coupled to the SDRAM and the synchronous flash memory 3 can be increased and the read access speed of the synchronous flash memory 3 can be restrained from dropping.

In the memory system 1 of the first embodiment equipped with the control circuit 2, the SDRAM and the synchronous flash memory 3, the control circuit 2 releases the ERASE setup command (COMCODE 2) or the PROGRAM setup command (COMCODE 2) to the first data input buffer 40 through the data input/output terminal DQ within the active command/write command execution cycle, in synchronization with the rising edge (time T3) of the clock signal CLK on which the level of the clock signal CLK changes from LOW to HIGH. In the first embodiment, the first data input buffer 40 receives either of the setup commands (COMCODE 2) through a idle terminal which is not inputting the WRITE command, on the rising edge (time T3) of the clock signal CLK on which the level of the clock signal CLK changes from LOW to HIGH. This eliminates the need for a special cycle period for receiving either of the setup commands (COMCODE 2). Therefore, provision of a special cycle period is unnecessary in cases where the SDRAM and the synchronous flash memory 3 are commonly coupled to the bus BUS of the control circuit 2 like this embodiment. Accordingly, the first embodiment does not present such a problem, unlike the prior art, that a special cycle period overlaps the SDRAM data output period, interrupting the output of data from the SDRAM. As result, in this embodiment, the utilization efficiency of the bus BUS coupled to the SDRAM and the synchronous flash memory 3 can be increased and the read access speed of the synchronous flash memory 3 can be restrained from dropping.

In the memory system 1 of the first embodiment equipped with the control circuit 2, the SDRAM and the synchronous flash memory 3, the control circuit 2 releases, in addition to the ACTIVE command ACTIVE and the WRITE command WRITE, the ERASE setup command (COMCODE 2) or PROGRAM setup command (COMCODE 2) to the first data input buffer 40 through a data input/output terminal DQ which is inputting no command, before starting WRITE access control to the memory cell array 80. In this embodiment, after the first data input buffer 40 has received the ERASE setup command or the PROGRAM setup command necessary for the WRITE access control of the synchronous flash memory 3 in addition to the WRITE command WRITE to be used in the SDRAM, the synchronous flash memory 3 can specify DATA WRITE operation for the memory cell array 80 or ERASE operation for the memory cell array 80 in accordance with the command received. Therefore, in this embodiment, the synchronous flash memory 3 can perform WRITE access control or READ access control on the memory cell array 80 in response to the ERASE setup command or the PROGRAM setup command in addition to the ACTIVE command ACTIVE and the WRITE command WRITE that are shared between the synchronous flash memory 3 and the SDRAM.

In the method of controlling the synchronous flash memory 3 according to the first embodiment, before starting WRITE access control to the memory cell array 80, an ERASE setup command (COMCODE 2) or PROGRAM setup command (COMCODE 2) is input in addition to an ACTIVE command ACTIVE and a WRITE command WRITE. Therefore, by use of the ERASE setup command or PROGRAM setup command necessary for the WRITE access control of the synchronous flash memory 3 in addition to the WRITE command WRITE which is to be used in the SDRAM, the synchronous flash memory 3 can specify DATA WRITE operation for the memory cell array 80 or ERASE operation for the memory cell array 80 in accordance with these setup commands. Therefore, according to the control method of the first embodiment, the synchronous flash memory 3 can perform WRITE access control or READ access control on the memory cell array 80 in response to the ERASE setup command or the PROGRAM setup command, while sharing the ACTIVE command ACTIVE and the READ command READ with the SDRAM.

In the memory system 1 of the first embodiment equipped with the control circuit 2, the SDRAM and the synchronous flash memory 3, the ERASE setup command (COMCODE 2) or the PROGRAM setup command (COMCODE 2) can be latched together with the WRITE command WRITE in synchronization with the rising edge (time T3) of the clock signal CLK on which the level of the clock signal CLK changes from LOW to HIGH. Therefore, according to the first embodiment, after the synchronous flash memory 3 latches the WRITE command WRITE and the ERASE setup command simultaneously at time T3, ERASE operation cab be immediately performed with these latched commands. In addition, according to the first embodiment, after the synchronous flash memory 3 latches the WRITE command WRITE and the PROGRAM setup command simultaneously at time T3, WRITE operation cab be immediately performed with these latched commands.

In the memory system 1 of the first embodiment equipped with the control circuit 2, the SDRAM and the synchronous flash memory 3, after receiving a WRITE command latch signal S8, the latency circuit 50 transmits a CAS latency command signal S9 to the first data input buffer 40. Upon receipt of the CAS latency command signal S9, the first data input buffer 40 latches data Din m input through the data input/output terminal DQ at time T4 (i.e., the rising edge of the clock signal CLK) upon which the CAS latency (which is, herein, WCL=1 shown in FIG. 2) of the WRITE access control elapses. Since the synchronous flash memory 3 latches the WRITE data Din m at time T4 after latching the WRITE command and the PROGRAM setup command at time T3, the synchronous flash memory 3 can immediately perform WRITE operation, using the WRITE command WRITE, PROGRAM setup command and WRITE data.

In the method of controlling the synchronous flash memory 3 according to the first embodiment, the ERASE setup command (COMCODE 2) or the PROGRAM setup command (COMCODE 2) can be latched together with the WRITE command WRITE in synchronization with the rising edge (time T3) of the clock signal CLK on which the level of the clock signal CLK changes from LOW to HIGH. According to the control method of this embodiment, after latching the WRITE command WRITE and ERASE setup command simultaneously at time T3, ERASE operation can be immediately performed using these latched commands. In addition, according to the control method of this embodiment, after latching the WRITE command WRITE and PROGRAM setup command simultaneously at time T3, WRITE operation can be immediately performed using these latched commands. In cases where the memory system 1 includes the SDRAM and synchronous flash memory 3 which are commonly coupled to the bus BUS like the first embodiment, the WRITE command WRITE necessary for the WRITE operation of the SDRAM and the WRITE operation of the synchronous flash memory 3 can be transmitted to the SDRAM and the synchronous flash memory 3 through the bus BUS by the control circuit 2. The SDRAM corresponds to the synchronous volatile memory of the invention whereas the synchronous flash memory 3 corresponds to the synchronous nonvolatile memory of the invention.

In the memory system 1 of the first embodiment equipped with the control circuit 2, the SDRAM and the synchronous flash memory 3, after the control circuit 2 releases an ACTIVE command ACTIVE to the active command decoder circuit 11 of the synchronous flash memory 3, the active command decoder circuit 11 releases a high-level active operation command signal S5 to the internal voltage generation circuit 20. After supplied with the high-level active operation command signal S5, the internal voltage generation circuit 20 generates a read voltage necessary for a read access to the memory cell of the memory cell array 80, as an initial operation. Therefore, in the invention, after an active command ACTIVE has been input to the active command decoder circuit 11, READ operation can be performed on the memory cell prior to WRITE operation on the memory cell. In this embodiment, delays in the READ operation performed on the memory cell as an initial operation by the synchronous flash memory 3 can be restrained.

In the memory system 1 of the first embodiment equipped with the control circuit 2, the SDRAM and the synchronous flash memory 3, if the write command decoder circuit 13 latches the WRITE command WRITE and the PROGRAM setup command or ERASE setup command while the internal voltage generation circuit 20 of the synchronous flash memory 3 generating the READ voltage necessary for a read access to the memory cell of the memory cell array 80, the write command decoder circuit 13 then transmits the SETUP command S6A or SETUP command S6B to the voltage control circuit 60. The setup command S6A is for instructing generation of the PROGRAM voltage necessary for writing data in the memory cell of the memory cell array 80. The SETUP command S6B is for instructing generation of the ERASE voltage necessary for erasing data from the memory cell of the memory cell array 80. In the memory system 1 of this embodiment, even when READ operation is performed on the memory cell before performing WRITE operation on the memory cell, the internal voltage generation circuit 20 can generate the WRITE voltage because the write command decoder circuit 13 has transmitted the SETUP command S6A or SETUP command S6B to the voltage control circuit 60. Therefore, in the memory system 1 of this embodiment, a transition from READ operation to WRITE operation can be made by use of the WRITE voltage generated by the internal voltage generation circuit 20.

Second Embodiment

Figure 3:
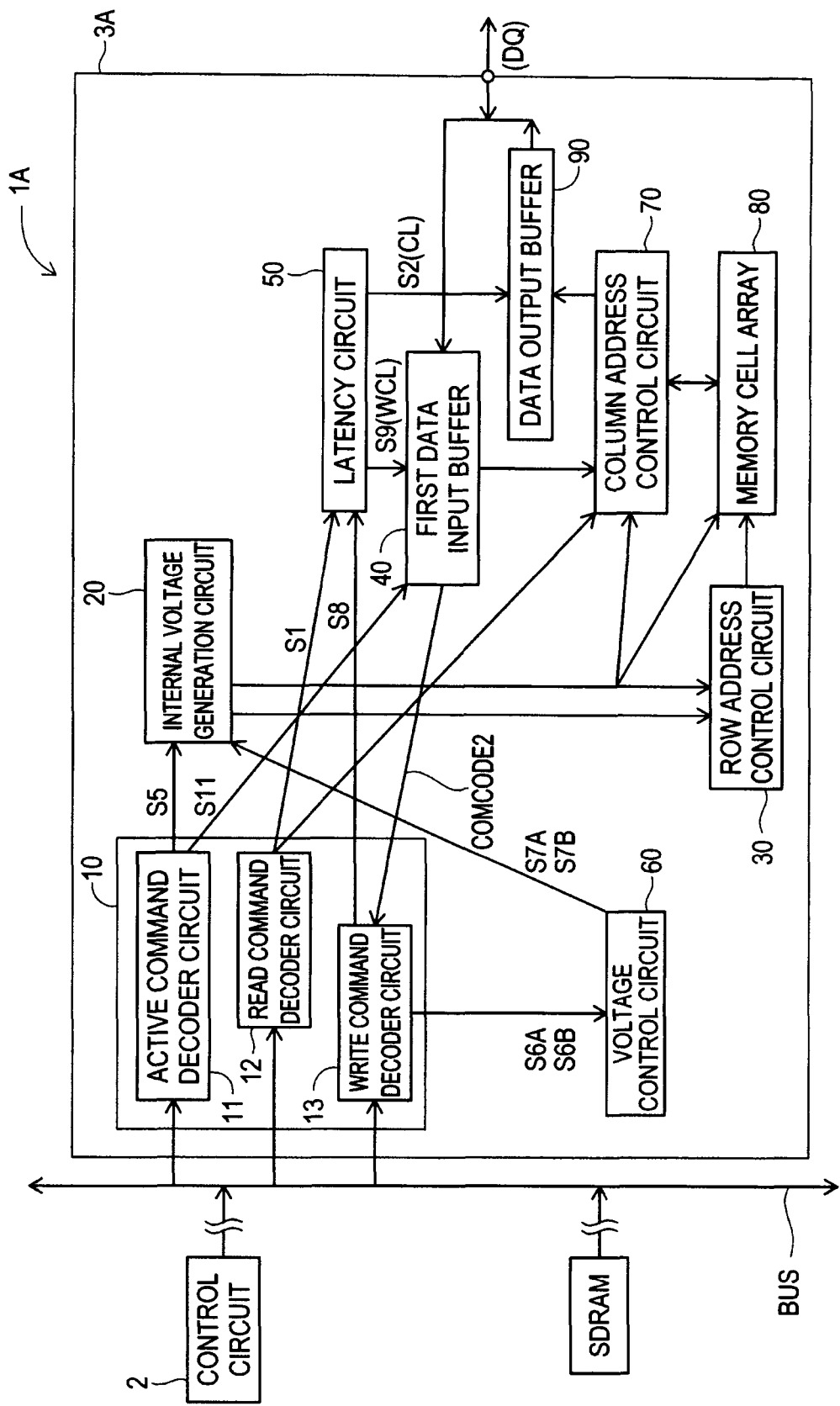
FIG. 3 is a schematic block diagram showing the circuit configuration of a memory system according to a second embodiment.
Figure 4:
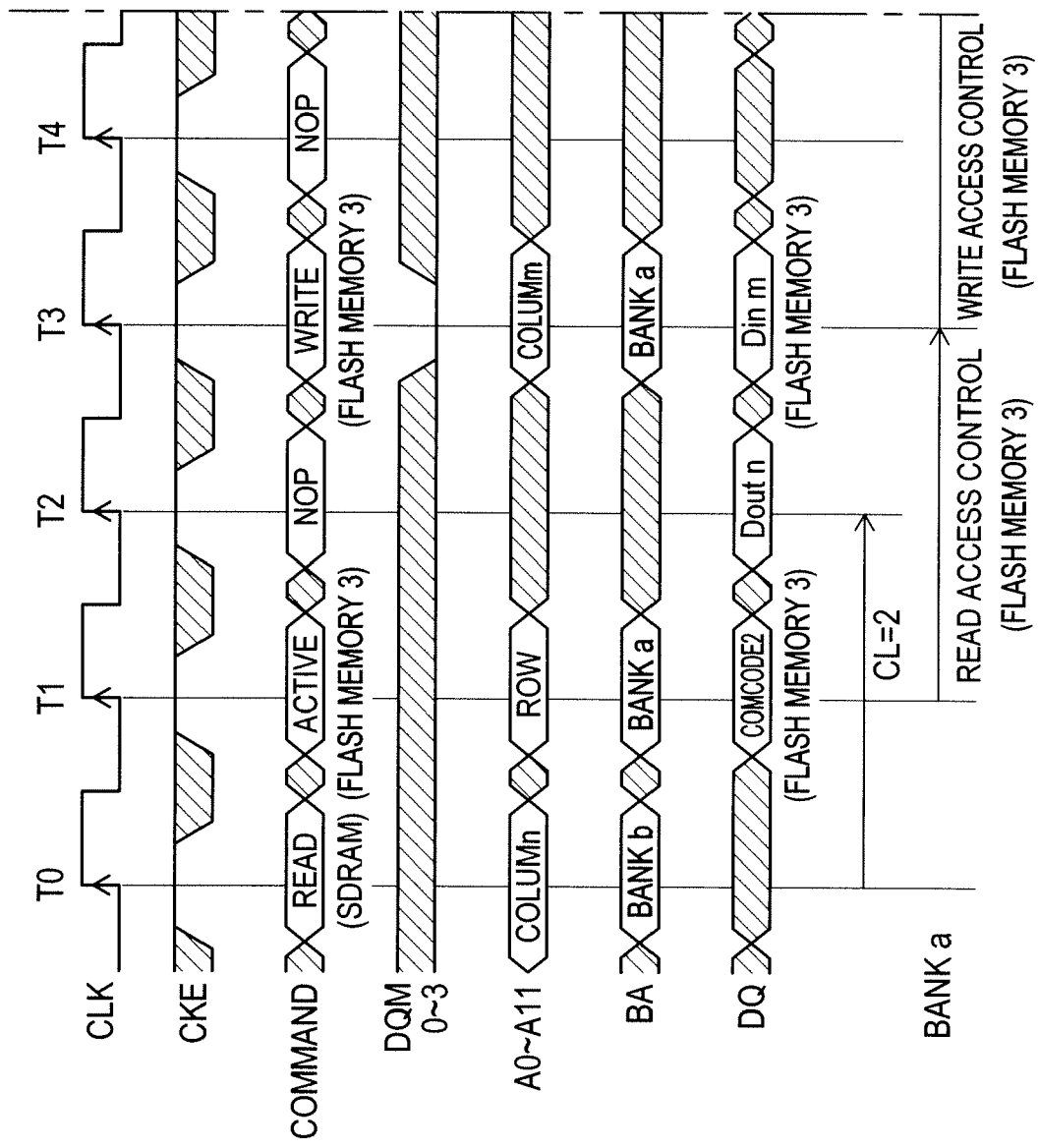
FIG. 4 is a timing chart showing the operation of the memory system according to the second embodiment.

Reference is made to FIGS. 3 and 4 to describe a second embodiment of the invention. FIG. 3 is a schematic block diagram showing the circuit configuration of a memory system 1A. In this figure, parts corresponding to those of the first embodiment are indicated by the same reference numerals as of the first embodiment and a description thereof is skipped. The memory system 1A has a synchronous flash memory 3A in place of the synchronous flash memory 3 of the first embodiment. In the synchronous flash memory 3A, the first data input buffer 40 is coupled to the active command decoder circuit 11 instead of the write command decoder circuit 13. Next, the operation of the memory system 1A will be described with reference to the timing chart of FIG. 4. Herein, an explanation of the same operation as of the first embodiment will be skipped. In comparison with the first embodiment, the synchronous flash memory 3A of the second embodiment is designed such that the timing of latching the PROGRAM setup command (COMCODE 2) or ERASE setup command (COMCODE 2) is earlier than the timing of latching the WRITE command WRITE and the same as the timing (time T1) of latching the ACTIVE command.

The active command decoder circuit 11 latches the ACTIVE command ACTIVE on the rising edge of the clock signal CLK (time T1) and, then, transmits an ACTIVE command latch signal S11 to the first data input buffer 40. Thereafter, the ERASE setup command (COMCODE 2) or PROGRAM setup command (COMCODE 2) which has been input through the data input/output terminal DQ is transmitted to the write command decoder circuit 13 by way of the first data input buffer 40. In the synchronous flash memory 3A, on the rising edge of the clock signal CLK (time T1), the ERASE setup command (COMCODE 2) or PROGRAM setup command (COMCODE 2) is latched together with a ROW address (ROW) and a BANK address (BANKa), in addition to the ACTIVE command ACTIVE.

In the synchronous flash memory 3A, the WRITE command WRITE, COLUMN address (COLUMm) and BANK address (BANKa) are latched on the rising edge of the clock signal CLK (time T3) similarly to the synchronous flash memory 3 of the first embodiment. Herein, the CAS latency (WCL) in WRITE access control is set to 0 (zero) in response to a CAS latency command signal S9, and at time T3, the first data input buffer 40 latches WRITE data input through the data input/output terminal DQ. Therefore, the input of the input mask terminal DQM is set to a LOW level at time T3. Subsequently after the write command decoder circuit 13 latches the ERASE setup command (COMCODE 2) or PROGRAM setup command (COMCODE 2) at time T1, the write command decoder circuit 13 latches the WRITE command WRITE at time T3. Thereafter, the write command decoder circuit 13 transmits the SETUP command S6A or SETUP command S6B to the voltage control circuit 60, similarly to the first embodiment.

Thereafter, the internal voltage generation circuit 20 generates the PROGRAM voltage or ERASE voltage, similarly to the first embodiment. The operation of the internal voltage generation circuit 20 is determined or altered in accordance with either of the ACTIVE operation command signal S5 and the SETUP command S6A or S6B which is first input to the internal voltage generation circuit 20. The ACTIVE operation command signal S5 is used for generation of the READ voltage and output from the ACTIVE command decoder circuit 11, the SETUP command S6A is for generation of the PROGRAM voltage and the SETUP command S6B is for generation of the ERASE voltage. To determine the times at which the ACTIVE operation command signal S5 and the SETUP command S6A or S6B are transferred to the internal voltage generation circuit 20 is a design item. However, owing to the arrangement designed taking account of the times at which the ACTIVE operation command signal S5 and the SETUP command S6A or S6B are transferred to the internal voltage generation circuit 20, the second embodiment has such an advantage over the first embodiment that losses in the READ voltage once generated by the internal voltage generation circuit 20 can be restrained. The second embodiment is intended to not only restraining drops in the read access speed of the synchronous flash memory 3 similarly to the first embodiment, but also restraining loses in the READ voltage that is once generated by the internal voltage generation circuit 20. As a result, the second embodiment can more significantly reduce power consumption, compared to the first embodiment.

The memory system 1A of the second embodiment equipped with the synchronous memory controller, the SDRAM and the synchronous flash memory 3A is constructed as follows. In response to the ACTIVE command ACTIVE latched by the active command decoder circuit 11 in synchronization with the rising edge (time T1) on which the level of the clock signal CLK changes from LOW to HIGH, the ERASE setup command (COMCODE 2) or PROGRAM setup command (COMCODE 2) released from the control circuit 2 is latched from the data input/output terminal DQ that does not input nor output data at time T1, while the memory cell of the memory cell array 80 being in an accessible condition. This enables the write command decoder circuit 13 to erase data from the memory cell by use of the ERASE setup command and WRITE command WRITE or write data in the memory cell by use of the PROGRAM setup command and WRITE command WRITE, while determining which of the ERASE setup command and PROGRAM setup command has been received, within the active command/write command execution cycle during which a group of commands is executed in response to the ACTIVE command ACTIVE and the WRITE command WRITE latched by the write command decoder circuit 13 at time T3 that is later than time T1. Apart from the active command/write command execution cycle for execution of a group of commands, the second embodiment does not need to provide a special cycle period for receiving and specifying the ERASE setup command or PROGRAM setup command prior to inputting of the ACTIVE command to the synchronous flash memory 3A. Accordingly, the second embodiment does not require a special cycle period and therefore does not present such a problem, unlike the prior art, that a special cycle period overlaps the SDRAM data output period, interrupting the data output of the SDRAM. As result, in this embodiment, the utilization efficiency of the bus BUS coupled to the SDRAM and the synchronous flash memory 3A can be increased and the read access speed of the synchronous flash memory 3 can be restrained from dropping.

According to the method of controlling the synchronous flash memory 3A of the second embodiment, in response to the ACTIVE command ACTIVE latched in synchronization with the rising edge (time T1) at which the level of the clock signal CLK changes from LOW to HIGH, the ERASE setup command (COMCODE 2) or PROGRAM setup command (COMCODE 2) is latched at time T1 while the memory cell of the memory cell array 80 being in an accessible condition. Thereby, the control method of the second embodiment enables erasing of data from a memory cell by use of the ERASE setup command and WRITE command WRITE and writing of data in a memory cell by use of the PROGRAM setup command and WRITE command WRITE, while determining which of the ERASE setup command and PROGRAM setup command has been received, within the active command/write command execution cycle during which a group of commands is executed in response to the active command ACTIVE and the WRITE command WRITE latched at time T3 that is later than time T1. Therefore, in the control method of the second embodiment, a special cycle period for receiving and specifying the ERASE setup command or PROGRAM setup command does not need to be provided prior to inputting of the ACTIVE command to the synchronous flash memory 3A, apart from the active command/write command execution cycle for execution of a group of commands. Accordingly, the control method of the second embodiment does not require a special cycle period and therefore does not present such a problem, unlike the prior art, that a special cycle period overlaps the SDRAM data output period, interrupting the data output of the SDRAM. As result, in the control method of the second embodiment, the utilization efficiency of the bus BUS coupled to the SDRAM and the synchronous flash memory 3A can be increased and the read access speed of the synchronous flash memory 3A can be restrained from dropping.

Third Embodiment

Figure 5:
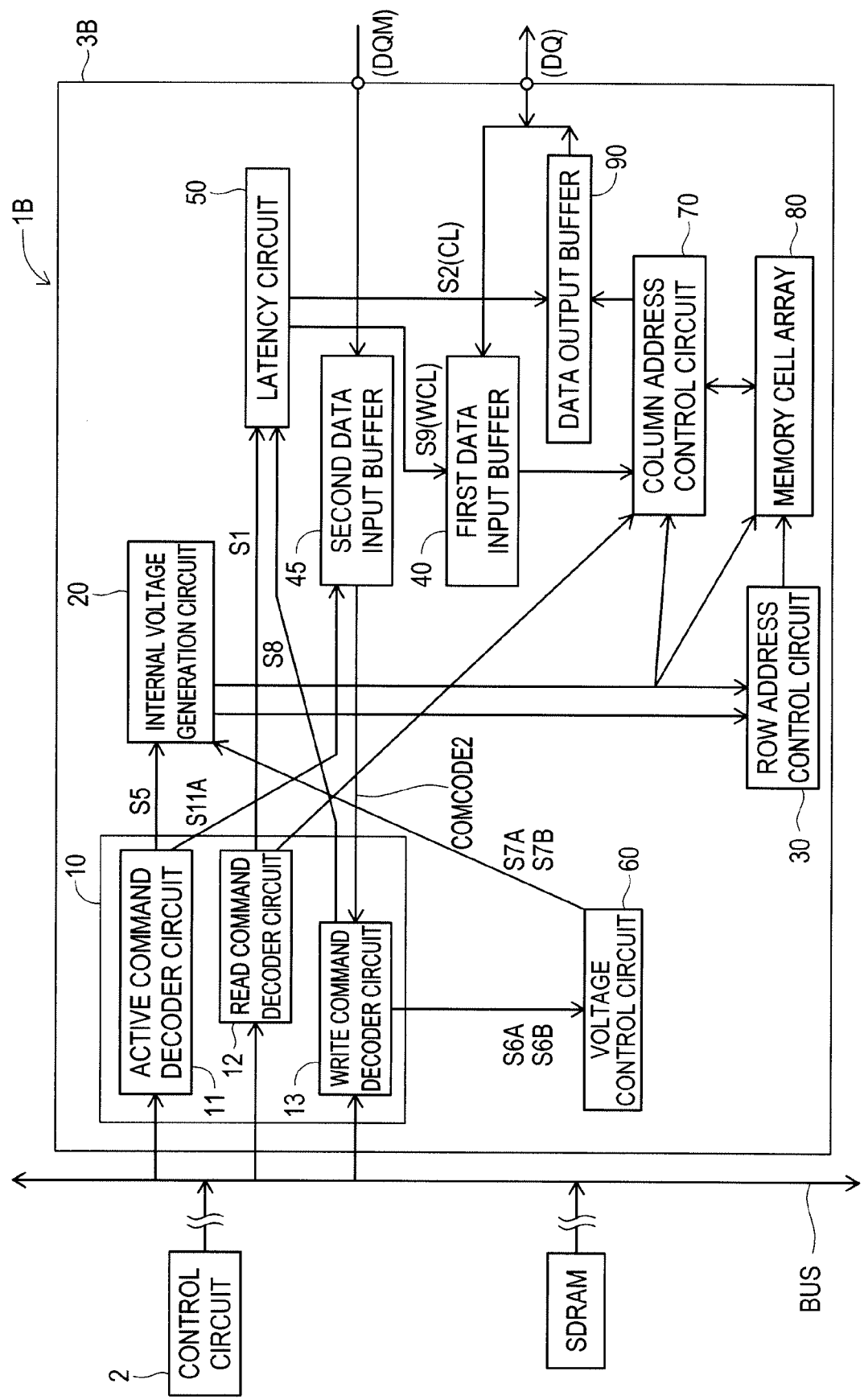
FIG. 5 is a schematic block diagram showing the circuit configuration of a memory system according to a third embodiment.
Figure 6:
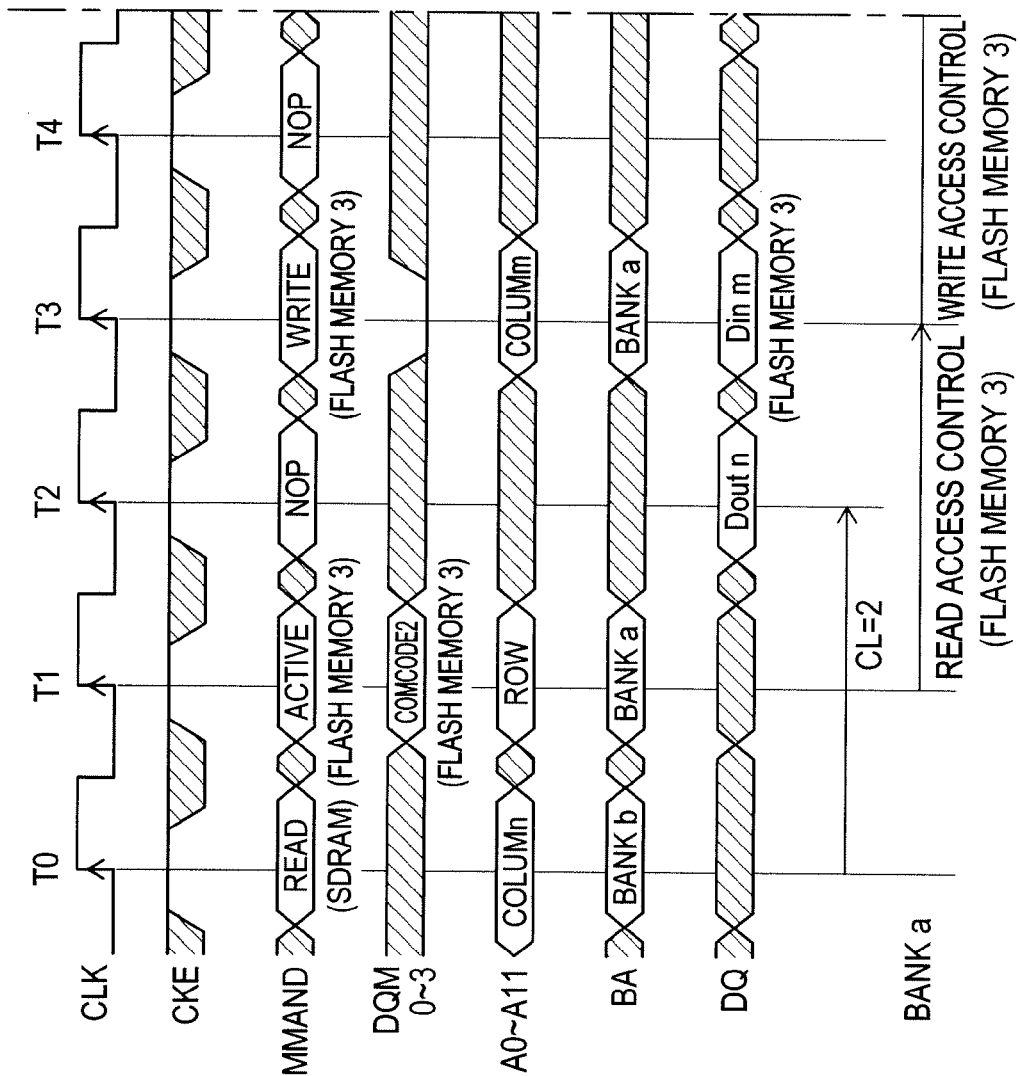
FIG. 6 is a timing chart showing the operation of the memory system according to the third embodiment.

Reference is made to FIGS. 5, 6 to describe a third embodiment of the invention. FIG. 5 is a schematic block diagram showing the circuit configuration of a memory system 1B. In this figure, parts corresponding to those of the first and second embodiments are indicated by the same reference numerals as of the first/second embodiments and a description thereof is skipped. The memory system 1B has a synchronous flash memory 3B in place of the synchronous flash memory 3 or 3A. In the synchronous flash memory 3B, a second data input buffer 45 is coupled to the active command decoder circuit 11 and the write command decoder circuit 13. Further, the second data input buffer 45 is coupled to the input mask terminal DQM of the synchronous flash memory 3B. The second data input buffer 45 corresponds to the second command receiving section of the invention.

Next, the operation of the memory system 1B will be described with reference to the timing chart of FIG. 6. Herein, an explanation of the same operation as of the first and second embodiments will be skipped. The timing of latching the PROGRAM setup command or ERASE setup command in the synchronous flash memory 3B of the third embodiment is made earlier than the timing of the WRITE command WRITE in the synchronous flash memory 3 of the first embodiment, similarly to the second embodiment. Unlike the first embodiment 1, in the synchronous flash memory 1B of the third embodiment, the ERASE setup command (COMCODE 2) or PROGRAM setup command (COMCODE 2) is input to the second data input buffer 45 through an input mask terminal DQM (see FIG. 5) that is not inputting nor outputting a command among the input mask terminals. The input mask terminal DQM that is not inputting nor outputting a command among the input mask terminals corresponds to the idle terminal of the invention.

After latching the ACTIVE command ACTIVE in synchronization with the rising edge (time T1) of the clock signal CLK, the active command decoder circuit 11 transmits an active command latch signal S11A to the second data input buffer 45. Thereafter, the ERASE setup command (COMCODE 2) or PROGRAM setup command (COMCODE 2) which has been input through the input mask terminal DQM is transmitted to the write command decoder circuit 13 by way of the second data input buffer 45. At time T1, the data input/output terminal DQ is set to "DON't CARE". In the synchronous flash memory 3B, the same steps as of the synchronous flash memory 3, 3A of the first and second embodiments are executed on and after time T1. Similarly to the first and second embodiments, the internal voltage generation circuit 20 of the synchronous flash memory 3B generates the PROGRAM voltage or ERASE voltage.

In the third embodiment, the latching of the ERASE setup command input to the write command decoder circuit 13 by way of the second data input buffer 45 and the latching of the PROGRAM setup command input to the write command decoder circuit 13 by way of the second data input buffer 45 correspond to the second command receiving step of the invention.

In the memory system 1B of the third embodiment equipped with the control circuit 2, the SDRAM and the synchronous flash memory 3B, in response to the ACTIVE command ACTIVE latched by the active command decoder circuit 11 at time T1 and in synchronization with the rising edge (time T1) at which the level of the clock signal CLK changes from LOW to HIGH, the ERASE setup command (COMCODE 2) or PROGRAM setup command (COMCODE 2) transmitted from the control circuit 2 is latched from the input mask terminal DQM that is not inputting nor outputting data, while the memory cell of the memory cell array 80 being in an accessible condition. Thereby, in the third embodiment, the write command decoder circuit 13 enables erasing of data from the memory cell by use of the ERASE setup command and WRITE command WRITE and writing of data in the memory cell by use of the PROGRAM setup command and WRITE command WRITE, while determining which of the ERASE setup command and PROGRAM setup command has been received, within the active command/write command execution cycle during which a group of commands is executed in response to the ACTIVE command ACTIVE and the WRITE command WRITE latched by the write command decoder circuit 13 at time T3 that is later than time T1. Therefore, in the third embodiment, a special cycle period for receiving and specifying the ERASE setup command or PROGRAM setup command does not need to be provided prior to inputting of the ACTIVE command to the synchronous flash memory 3B, apart from the active command/write command execution cycle for execution of a group of commands. Accordingly, the third embodiment does not require a special cycle period and therefore does not present such a problem, unlike the prior art, that a special cycle period overlaps the SDRAM data output period, interrupting the data output of the SDRAM. As result, in this embodiment, the utilization efficiency of the bus BUS coupled to the SDRAM and the synchronous flash memory 3B can be increased and the read access speed of the synchronous flash memory 3B can be restrained from dropping.

According to the method of controlling the synchronous flash memory 3B of the third embodiment, in response to the ACTIVE command ACTIVE latched at time T1 and in synchronization with the rising edge (time T1) at which the level of the clock signal CLK changes from LOW to HIGH, the ERASE setup command (COMCODE 2) or PROGRAM setup command (COMCODE 2) is latched, while the memory cell of the memory cell array 80 being in an accessible condition. Thereby, the control method of the third embodiment enables erasing of data from the memory cell by use of the ERASE setup command and WRITE command WRITE and writing of data in the memory cell by use of the PROGRAM setup command and WRITE command WRITE, while determining which of the ERASE setup command and PROGRAM setup command has been received, within the active command/write command execution cycle during which a group of commands is executed in response to the ACTIVE command ACTIVE and the WRITE command WRITE latched at time T3 that is later than time T1. Therefore, in the control method of the third embodiment, a special cycle period for receiving and specifying an ERASE setup command or PROGRAM setup command does not need to be provided prior to inputting of the ACTIVE command to the synchronous flash memory 3B, apart from the active command/write command execution cycle for execution of a group of commands. Accordingly, the control method of the third embodiment does not require a special cycle period and therefore does not present such a problem, unlike the prior art, that a special cycle period overlaps the SDRAM data output period, interrupting the data output of the SDRAM. As result, in the control method of the third embodiment, the utilization efficiency of the bus BUS coupled to the SDRAM and the synchronous flash memory 3B can be increased and the read access speed of the synchronous flash memory 3B can be restrained from dropping.

Fourth Embodiment

Figure 7:
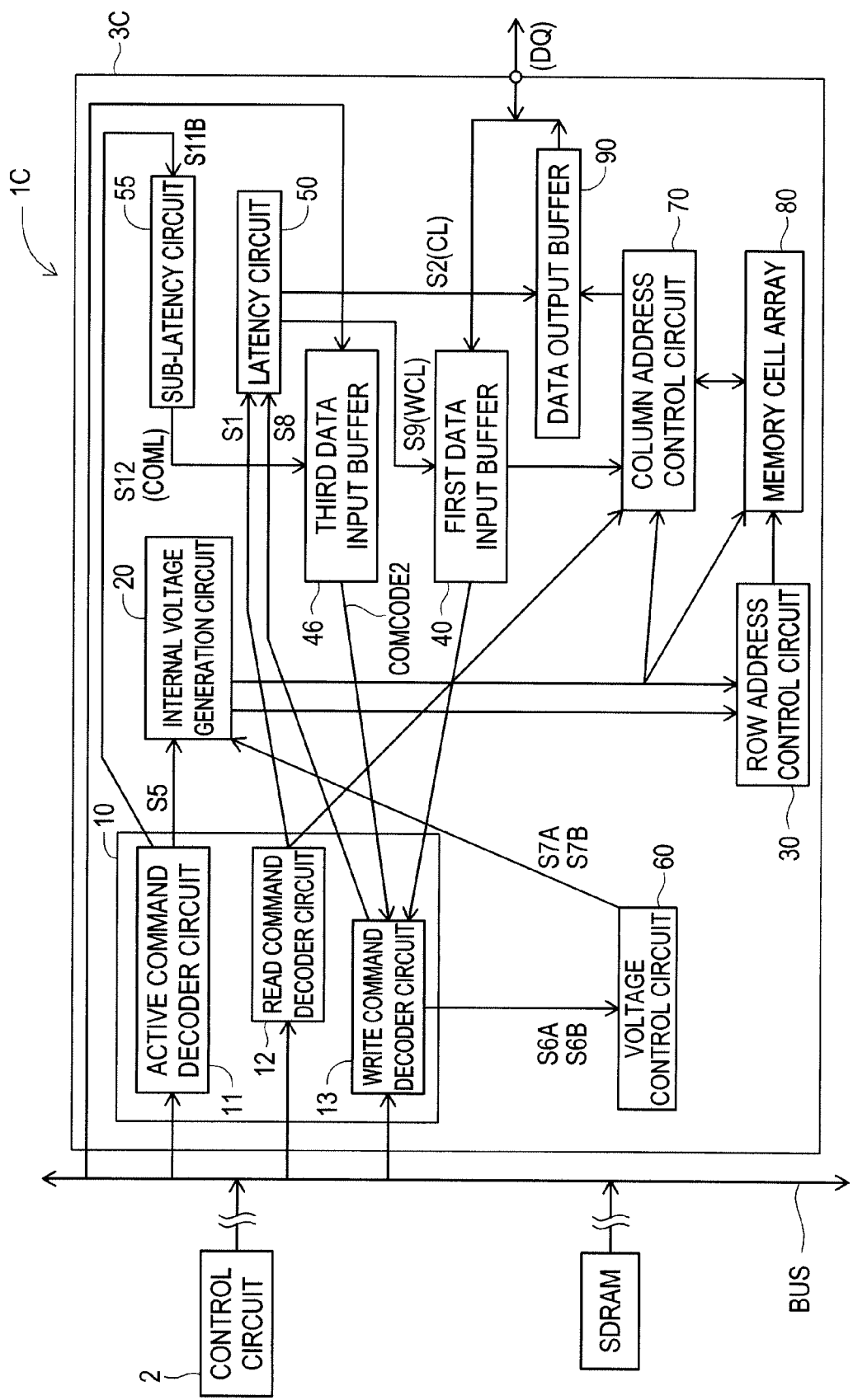
FIG. 7 is a schematic block diagram showing the circuit configuration of a memory system according to a fourth embodiment.
Figure 8:
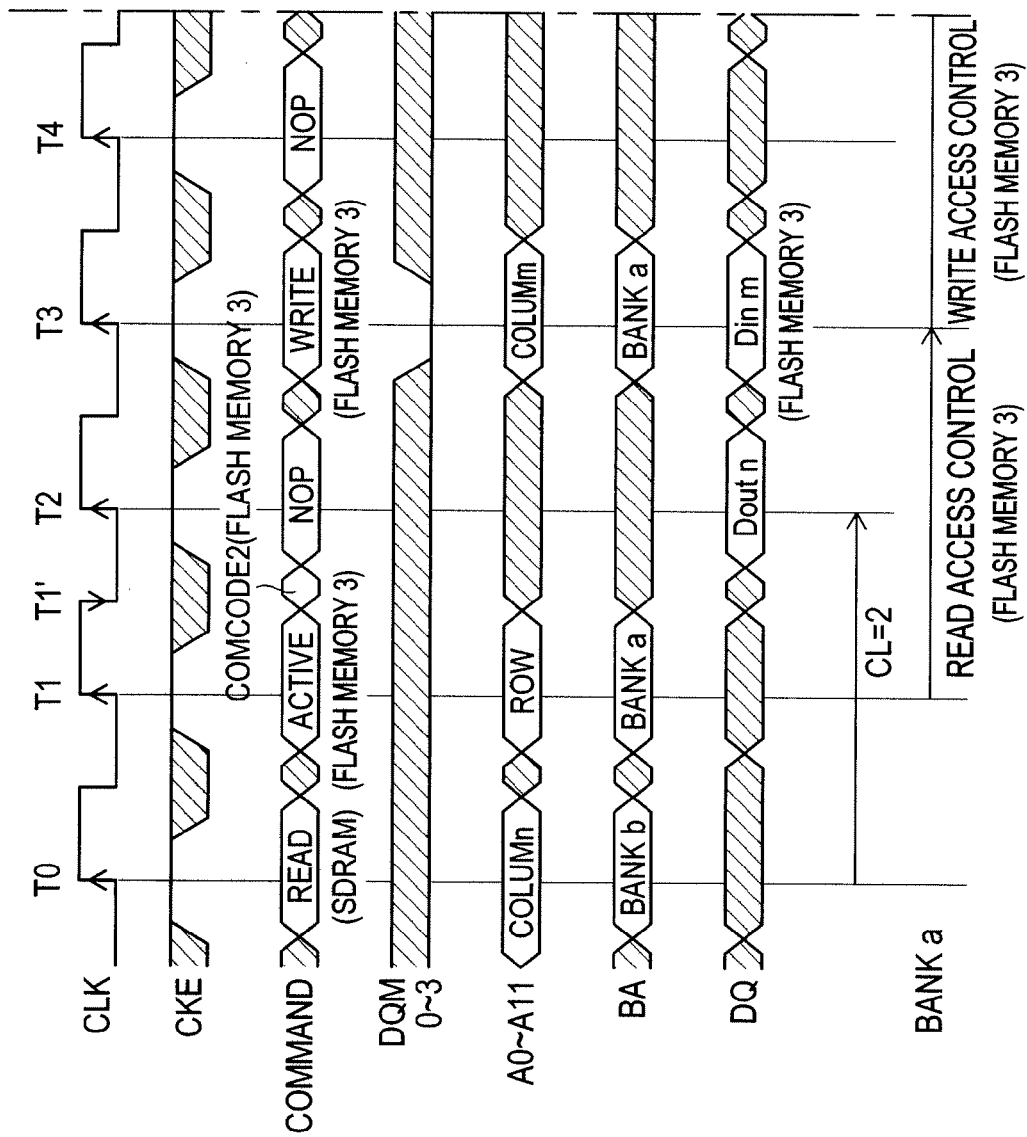
FIG. 8 is a timing chart showing the operation of the memory system according to the fourth embodiment.

Reference is made to FIGS. 7, 8 to describe a fourth embodiment of the invention. FIG. 7 is a schematic block diagram showing the circuit configuration of a memory system 1C. In this figure, parts corresponding to those of the third embodiment are indicated by the same reference numerals as of the third embodiment and a description thereof is skipped. The memory system 1C has a synchronous flash memory 3C in place of the synchronous flash memory 3B. The synchronous flash memory 3C includes a third data input buffer 46 in place of the second data input buffer 45. The third data input buffer 46 is coupled to the bus BUS together with the command decoder circuit 10 of the synchronous flash memory 3C. A sub-latency circuit 55 receives an active command latch signal S11B output from the active command decoder circuit 11 and an external clock signal CLK and outputs a command latency signal S12 to the third data input buffer 46. The third data input buffer 46 is coupled to the bus BUS and receives the command latency signal S12. The third data input buffer 46 outputs the ERASE setup command (COMCODE 2) or PROGRAM setup command (COMCODE 2) to the WRITE command decoder circuit 13. The third data input buffer 46 corresponds to the second command receiving section of the invention.

Next, the operation of the memory system 1C will be described with reference to the timing chart of FIG. 8. Herein, an explanation of the same operation as of the third embodiment will be skipped. In the synchronous flash memory 3C of the fourth embodiment, the ACTIVE command ACTIVE is latched on the rising edge (time T1) on which the level of the clock signal CLK changes from LOW to HIGH and subsequently, the ERASE setup command (COMCODE 2) or PROGRAM setup command (COMCODE 2) is latched on the falling edge (time T1') on which the level of the clock signal CLK changes from HIGH to LOW. At time T1, the data input/output terminal DQ and the input mask terminal DQM are set to "DON't CARE". At time T1', the signal input terminals A0 to A11, bunk address input terminal BA, data input/output terminal DQ and input mask terminal DQM are respectively set to "DON't CARE".

In the synchronous flash memory 3C of the fourth embodiment, the ERASE setup command (COMCODE 2) or PROGRAM setup command (COMCODE 2) is input from the command input/output terminal when no command is input and output and upon or after input of the ACTIVE command ACTIVE. The command input/output terminal is coupled to the bus BUS. After latching the ACTIVE command ACTIVE on the rising edge (time T1) of the clock signal CLK, the active command decoder circuit 11 transmits an active command latch signal S11B to the sub-latency circuit 55. The sub-latency circuit 55 outputs a command latency signal S12 to the third data input buffer 46 on the edge of the external clock CLK after an elapse of a specified cycle (COML=0.5 in the fourth embodiment) determined by a command latency COML. After latching the command latency signal S12, the third data input buffer 46 latches data on the bus BUS and outputs a command code to the write command decoder circuit 13. The rising edge (time T1) of the clock signal CLK corresponds to the first edge of the invention.

More concretely, the ERASE setup command (COMCODE 2) or PROGRAM setup command (COMCODE 2) is input to the third data input buffer 46 in synchronization with the falling edge (time T1') of the clock signal CLK. The third data input buffer 46 transmits the ERASE setup command (COMCODE 2) or PROGRAM setup command (COMCODE 2) to the write command decoder circuit 13. The falling edge (time T1') of the clock signal CLK corresponds to the second edge of the invention. In the synchronous flash memory 3C, the same steps as of the synchronous flash memory 3A of the second embodiment are executed on and after time T1'. The internal voltage generation circuit 20 of the synchronous flash memory 3C generates the PROGRAM voltage or ERASE voltage. The latching of the ERASE setup command input to the write command decoder circuit 13 through the third data input buffer 46 and the latching of the PROGRAM setup command input to the write command decoder circuit 13 through the third data input buffer 46 respectively correspond to the second command receiving step of the invention. It should be noted that the value of the command latency COML is not limited to 0.5 but may be 1. In this case, at time T2 between the latching time of the ACTIVE command ACTIVE and the latching time of the WRITE command WRITE, the third data input buffer 46 latches the ERASE setup command (COMCODE 2) or PROGRAM setup command (COMCODE 2).

Although the setup commands (COMCODE 2) are both input to and latched by the third data input buffer 46 in response to the command latency signal S12 output from the sub-latency circuit 55 in the fourth embodiment, the invention is not limited to this. For instance, the third data input buffer 46 may be constructed so as to have the function of the command decoder circuit 10. More concretely, the third data input buffer 46 having the function of the command decoder circuit 10 is coupled to the bus BUS to which a chip select signal, a low address strobe signal RAS input to the command decoder circuit of the SDRAM, a column address strobe signal CAS, a write enable signal WE and others which are input to the command decoder circuit of the SDRAM are transmitted, and the ACTIVE command latch signal S11B may be input to the third data input buffer 46. In this case, if the ACTIVE command latch signal S11B is in its active state, the third data input buffer 46 having the function of the command decoder circuit 10 takes and latches both setup commands (COMCODE 2) on the bus BUS.

The fourth embodiment may be modified such that both setup commands (COMCODE 2) are directly input to the voltage control circuit 60 instead of the write command decoder circuit 13. Thereby, the voltage control circuit 60 can output the PROGRAM voltage control signal S7A or ERASE voltage control signal S7B to the internal voltage generation circuit 20 without waiting the WRITE command WRITE to be latched at time T3. Thereby, the READ voltage necessary for a read access can be quickly changed to the PROGRAM voltage or ERASE voltage in the synchronous flash memory 3C. Also, in the second and third embodiments, both setup commands (COMCODE 2) may be directly input to the voltage control circuit 60.

In the memory system 1C of the fourth embodiment equipped with the control circuit 2, the SDRAM and the synchronous flash memory 3C, in response to the ACTIVE command ACTIVE latched by the active command decoder circuit 11 at time T1 and in synchronization with the falling edge (time T1') of the clock signal CLK that is the time between the latching time of an ACTIVE command ACTIVE and the latching time of the WRITE command WRITE, the ERASE setup command (COMCODE 2) or PROGRAM setup command (COMCODE 2) is input to the third data input buffer 46 from a command input/output terminal that is not inputting nor outputting a command among the input/output terminals, while the memory cell of the memory cell array 80 being in an accessible condition. That is, in the fourth embodiment, a special cycle period for receiving and specifying the ERASE setup command or PROGRAM setup command does not need to be provided prior to inputting of the ACTIVE command to the synchronous flash memory 3C, apart from the active command/write command execution cycle for execution of a group of commands. Accordingly, in the fourth embodiment, since the ERASE setup command (COMCODE 2) or PROGRAM setup command (COMCODE 2) is input to the third data input buffer 46 through a command input/output terminal that is not inputting nor outputting a command, both setup commands (COMCODE 2) can be input to the third data input buffer 46 without interrupting data from the SDRAM to be input to the data input/output terminal DQ. In addition, both setup commands (COMCODE 2) can be input to the third data input buffer 46 without interrupting a signal transmitted from the control circuit 2 to be input to the input mask terminal DQM that enables or disables the data input/output terminal DQ. In the fourth embodiment, since inputting of data output from the SDRAM to the data input/output terminal DQ is not interrupted, the utilization efficiency of the bus BUS coupled to the SDRAM and the synchronous flash memory 3C can be increased and the read access speed of the synchronous flash memory 3C can be restrained from dropping.

According to the method of controlling the synchronous flash memory 3C of the fourth embodiment, in response to the ACTIVE command ACTIVE latched at time T1 and in synchronization with the falling edge (time T1') of the clock signal CLK that is the time between the latching time of the ACTIVE command ACTIVE and the latching time of the WRITE command WRITE, the third data input buffer 46 receives the ERASE setup command (COMCODE 2) or PROGRAM setup command (COMCODE 2) from a command input/output terminal that is not inputting nor outputting a command among the command input/output terminals, while the memory cell of the memory cell array 80 being in an accessible condition. Therefore, in the control method of the third embodiment, a special cycle period for receiving and specifying an ERASE setup command or PROGRAM setup command does not need to be provided prior to inputting of the ACTIVE command to the synchronous flash memory 3C, apart from the active command/write command execution cycle for execution of a group of commands. In the control method of the fourth embodiment, since the third data input buffer 46 receives the ERASE setup command (COMCODE 2) or PROGRAM setup command (COMCODE 2) through a command input/output terminal that is not inputting nor outputting a command, both setup commands (COMCODE 2) can be input to the third data input buffer 46 without interrupting data from the SDRAM to be input to the data input/output terminal DQ. In addition, in the control method of the fourth embodiment, both setup commands (COMCODE 2) can be input to the third data input buffer 46 without interrupting a signal transmitted from the control circuit 2 to be input to the input mask terminal DQM that enables or disables the data input/output terminal DQ. In the control method of the fourth embodiment, since inputting of data output from the SDRAM to the data input/output terminal DQ is not interrupted, the utilization efficiency of the bus BUS coupled to the SDRAM and the synchronous flash memory 3C can be increased and the read access speed of the synchronous flash memory 3C can be restrained from dropping.

The invention is not necessarily limited to the particular embodiments shown herein and the disclosed arrangements may be partially modified without departing from the spirit and scope of the invention. For instance, the fourth embodiment described earlier may be modified such that the phase of the clock signal CLK is reversed and the ACTIVE command ACTIVE, ROW command (ROW) and bank address value (BANKa) are respectively latched on the falling edge of the clock signal having a reversed phase, whereas the ERASE setup command and PROGRAM setup command are input to the third data input buffer 46 in synchronization with the rising edge of the clock signal having a reversed phase. It is apparent that the invention is applicable to double data rate synchronous flash memories.

The first to fourth embodiments may be modified such that a setup command input terminal is provided apart from the data input/output terminal DQ, input mask terminal DQM, command input/output terminal which are existing terminals, and the ERASE setup command or PROGRAM setup command are input to the synchronous flash memory through the setup command input terminal. Additionally, the control circuit 2 may be packed in another LSI package that is different from the one in which the memory devices (SDRAM, synchronous flash memory) are packed. For example, the SDRAM and synchronous flash memory may be packed in one LSI package to form a MCP, whereas the control circuit 2 is packed in another LSI package. An alternative example is an assembly package in which a plurality of memory devices are housed. Alternatively, package on package (POP) may be employed. The invention is also applicable to memory systems, which have, unlike the first to fourth embodiments, synchronous volatile memories other than SDRAMs and synchronous nonvolatile memories other than flash memories.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:
1. A memory device, comprising:
a first synchronous memory controlled by a second group of commands, comprising:
a first command receiving section for receiving a first group of commands; and
a second command receiving section for receiving a command that is unique to the first synchronous memory and different from the first group of commands during execution of the first group of commands received by the first command receiving section; and
a second synchronous memory controlled by the first group of commands, wherein the first synchronous memory and the second synchronous memory are coupled to a same data bus; wherein the second group of commands is different from the first group of commands, and wherein the first group of commands are executed by the second synchronous memory, which is a volatile memory, while the second group of commands are received by the second command receiving section of the first synchronous memory, which is a non-volatile memory.

2. The memory device according to claim 1, wherein the second command receiving section receives the unique command in synchronization with a clock signal through an idle terminal.

3. The memory device according to claim 2,
wherein the first group of commands comprises an active command and a read command that is issued later than issuance of the active command or alternatively comprises an active command and a write command that is issued later than issuance of the active command; and
wherein the unique command comprises a program mode operation command for instructing writing of data in a memory device of the first synchronous memory or an erase mode operation command for instructing erasing of data in the memory device.

4. The memory device according to claim 3, wherein the second command receiving section receives, in synchronization with the clock signal, the program mode operation command or the erase mode operation command through the idle terminal during execution of the write command.

5. The memory device according to claim 4, further comprising a latency circuit for determining the latency between receipt of the write command and receipt of write data to be written in the memory device, in synchronization with the clock signal after receipt of the write command.

6. The memory device according to claim 3, wherein the second command receiving section receives, in synchronization with the clock signal, the program mode operation command or the erase mode operation command through the idle terminal during execution of the active command.

7. The memory device according to claim 3, wherein the second command receiving section receives, in synchronization with a second edge of the clock signal that is different from a first edge of the clock signal on which the first group of commands is received, the program mode operation command or the erase mode operation command through the idle terminal during execution of the active command.

8. The memory device according to claim 1,
wherein the first command receiving section further comprises an active command receiving section for receiving the active command, and a voltage generating section configured to generate a voltage to be applied to the memory device; and
wherein the voltage generating section generates, in response to the active command received by the active command receiving section, a read voltage necessary for reading from the memory device.

9. The memory device according to claim 8, wherein the first command receiving section further comprises:
a write command receiving section for receiving the write command; and
a generation voltage alteration section for altering a voltage generated by the voltage generating section to a write voltage necessary for writing in the memory device, on the condition that the write command receiving section received the write command or the unique command transferred by the second command receiving section during generation of the read voltage.

10. A synchronous memory, comprising:
a first synchronous memory controlled by a second group of commands;
a second synchronous memory controlled by a first group of commands; and
a synchronous memory controller for issuing the first group of commands in response to a clock signal and issuing a command that is unique to the first synchronous memory and different from the first group of commands,
wherein the first synchronous memory and the second synchronous memory are coupled to a same data bus; wherein the second group of commands is different from the first group of commands, and wherein the first group of commands are executed by the second synchronous memory, which is a volatile memory, while the second group of commands for the first synchronous memory, which is a non-volatile memory, are issued by the synchronous memory controller.

11. The synchronous memory according to claim 10, wherein the synchronous memory controller issues, in synchronization with the clock signal during execution of the first group of commands, the unique command to a idle terminal of the first synchronous memory which terminal is not inputting a command.

12. The synchronous memory according to claim 11,
wherein the first group of commands comprises an active command and a read command that is issued later than issuance of the active command or alternatively comprises an active command and a write command that is issued later than issuance of the active command; and
wherein the unique command comprises a program mode operation command for instructing writing of data in a memory device of the first synchronous memory or an erase mode operation command for instructing erasing of data in the memory device.

13. The synchronous memory according to claim 12, wherein the first synchronous memory is a synchronous non-volatile memory whereas the second synchronous memory is a synchronous volatile memory.

14. The synchronous memory according to claim 13, wherein the synchronous memory controller issues, in synchronization with the clock signal, the program mode operation command or the erase mode operation command to the idle terminal during execution of the write command.

15. The synchronous memory according to claim 14, wherein the synchronous memory controller writes data to be written in the memory device in synchronization with the clock signal on condition that a specified latency has elapsed after issuance of the write command.

16. The synchronous memory according to claim 13, wherein the synchronous memory controller issues, in synchronization with the clock signal, the program mode operation command or the erase mode operation command to the idle terminal during execution of the active command.

17. The synchronous memory according to claim 13, wherein the synchronous memory controller issues, in synchronization with a second edge of the clock signal that is different from a first edge of the clock signal on which the first group of commands is received, the program mode operation command or the erase mode operation command to the idle terminal during execution of the active command.

18. A synchronous memory control method, comprising:
receiving a first group of commands for controlling a second synchronous memory in a first command receiving section of a first synchronous memory controlled by a second group of commands; and
receiving a command that is unique to the first synchronous memory and different from the first group of commands in a second command receiving section during execution of the first group of commands, wherein the first synchronous memory and the second synchronous memory are coupled to a same data bus; wherein the second group of commands is different from the first group of commands, and wherein the first group of commands are executed by the second synchronous memory, which is a volatile memory, while the second group of commands are received by the second command receiving section of the first synchronous memory, which is a non-volatile memory.

19. The synchronous memory control method according to claim 18,
wherein the first group of commands comprises an active command and a read command that is issued later than issuance of the active command or alternatively comprises an active command and a write command that is issued later than issuance of the active command; and
wherein the unique command comprises a program mode operation command for instructing writing of data in a memory device of the first synchronous memory or an erase mode operation command for instructing erasing of data in the memory device.

20. The synchronous memory control method according to claim 19,
wherein, during the receiving the command, the program mode operation command or the erase mode operation command is received in synchronization with the clock signal during execution of the write command after a start of execution of the active command.

* * * * *